(12) United States Patent
Lee et al.

(10) Patent No.: US 11,762,277 B2
(45) Date of Patent: Sep. 19, 2023

(54) EUV PHOTOMASK

(71) Applicant: Samsung Electronics Co., Ltd., Suwon-si (KR)

(72) Inventors: Moosong Lee, Seoul (KR); Seongbo Shim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 271 days.

(21) Appl. No.: 17/358,785

(22) Filed: Jun. 25, 2021

(65) Prior Publication Data

US 2022/0128897 A1  Apr. 28, 2022

(30) Foreign Application Priority Data

Oct. 27, 2020  (KR) .......................... 10-2020-0140088

(51) Int. Cl.
*G03F 1/22* (2012.01)
*G03F 1/24* (2012.01)

(52) U.S. Cl.
CPC . *G03F 1/22* (2013.01); *G03F 1/24* (2013.01)

(58) Field of Classification Search
CPC .................................... G03F 1/22; G03F 1/24
USPC ............................................................ 430/5
See application file for complete search history.

(56) References Cited

U.S. PATENT DOCUMENTS

| | | |
|---|---|---|
| 7,376,512 B2 | 5/2008 | Hirscher et al. |
| 7,642,017 B2 | 1/2010 | Huh et al. |
| 7,960,076 B2 | 6/2011 | Kamo et al. |
| 8,691,476 B2 | 4/2014 | Yu et al. |
| 9,465,286 B2 | 10/2016 | Kim et al. |
| 9,535,332 B2 | 1/2017 | Ruoff et al. |
| 9,869,928 B2 | 1/2018 | Huang et al. |

*Primary Examiner* — Christopher G Young
(74) *Attorney, Agent, or Firm* — Harness, Dickey & Pierce, P.L.C.

(57) ABSTRACT

An EUV photomask may include a multi-layered structure on a substrate, a capping layer on the multi-layered structure, and an absorber on the capping layer. The absorber may include a first sidewall and a second sidewall. The first sidewall may extend from an upper surface of the capping layer in a vertical direction substantially perpendicular to an upper surface of the substrate, and may be a flat plane. The second sidewall may extend from the first sidewall in the vertical direction, and may be a curved surface.

20 Claims, 11 Drawing Sheets

EUV PHOTOMASK

CROSS-REFERENCE TO RELATED APPLICATION

This application claims priority under 35 U.S.C. § 119 to Korean Patent Application No. 10-2020-0140088, filed on Oct. 27, 2020 in the Korean Intellectual Property Office, the disclosure of which is hereby incorporated by reference in its entirety.

TECHNICAL FIELD

Example embodiments of the present disclosure relate to an EUV photomask. More particularly, example embodiments of the present disclosure relate to an EUV photomask for EUV lithography.

DISCUSSION OF RELATED ART

In an extreme ultraviolet (EUV) lithography, a mask 3-dimensional (3D) effect, such as a shadowing effect, may occur due to the slope of an EUV light incident on a photomask and the thickness of an absorber included in the photomask. In order to solve the mask 3D effect, the thickness of the absorber may be reduced, however, in this case, the effect of blocking EUV light by the absorber may decrease so that the contrast and the uniformity of critical dimension (CD) of image may decrease.

SUMMARY

Example embodiments provide an EUV photomask having enhanced characteristics.

According to example embodiments of inventive concepts, there is an EUV photomask. The EUV photomask may include a substrate, a multi-layered structure on the substrate, a capping layer on the multi-layered structure, and an absorber on the capping layer. The absorber may include a first sidewall and a second sidewall. The first sidewall may extend from an upper surface of the capping layer in a vertical direction substantially perpendicular to an upper surface of the substrate, and may be a flat plane. The second sidewall may extend from the first sidewall in the vertical direction, and may be a curved surface.

According to example embodiments of inventive concepts, there is an EUV photomask. The EUV photomask may include a substrate, a multi-layered structure on the substrate, a capping layer on the multi-layered structure, and an absorber on the capping layer. A cross-section of the absorber in a vertical direction substantially perpendicular to an upper surface of the substrate may have a shape of a rounded rectangle in which two upper corners are rounded.

According to example embodiments of inventive concepts, there is an EUV photomask. The EUV photomask may include a substrate, a multi-layered structure on the substrate, a capping layer on the multi-layered structure, and an absorber on the capping layer. A cross-section of the absorber in a vertical direction substantially perpendicular to an upper surface of the substrate may have a shape of at least a portion of a circle or ellipse.

In the EUV photomask in accordance with example embodiments, the absorber may have a cross-section in the vertical direction having a shape of a rounded rectangle, or a shape of a circuit or ellipse, and thus the EUV photomask may have a reduced mask 3D effect such as the shadowing effect, and may have reduced telecentricity errors and MEEF. In some cases, the EUV photomask may have enhanced contrast.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, example embodiments of inventive concepts will be illustrated in detail with reference to attached drawings.

Figure 1:
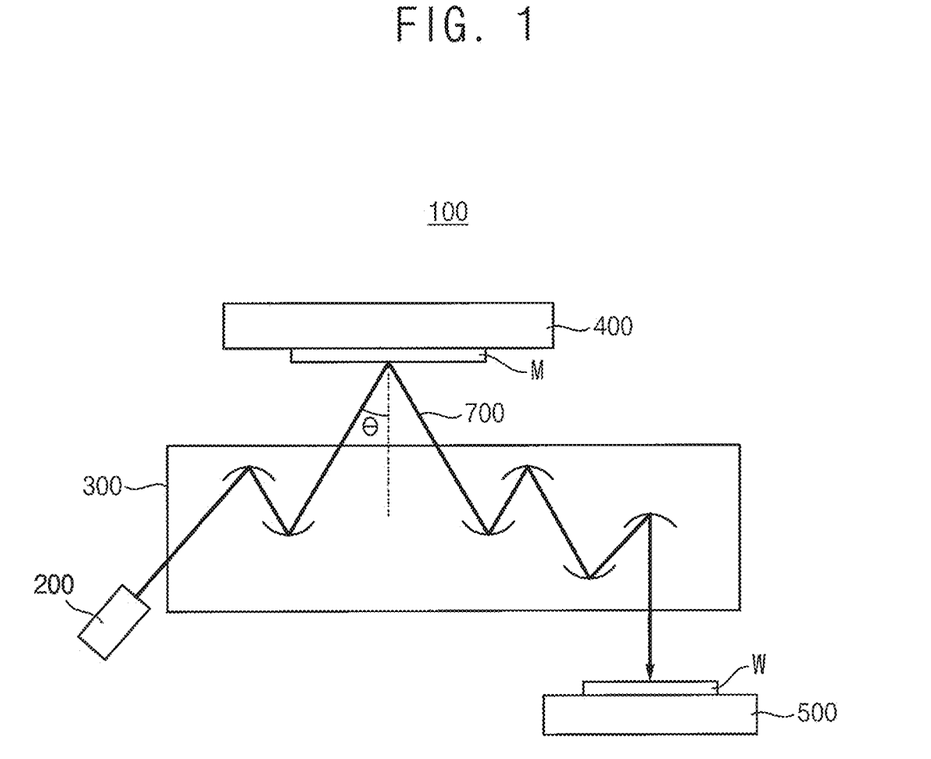
FIG. 1 is a schematic cross-sectional view illustrating an EUV lithography system in accordance with example embodiments.

FIG. 1 is a schematic cross-sectional view illustrating an EUV lithography system in accordance with example embodiments.

Referring to FIG. 1, an EUV lithography system 100 may include a light emitting part 200, an optical system 300, a mask stage 400 and a wafer stage 500.

In example embodiments, the EUV lithography system 100 may perform a lithography process using an EUV light 700 and a photomask M.

Particularly, the light emitting part 200 may include, e.g., a light source, a light collector, etc. The light source may generate the EUV light 700 having a wavelength of about 13.5 nm using, e.g., plasma source, laser induced source, electric discharge gas plasma source, etc. The EUV light 700 may pass through the light collector to be incident into the optical system 300.

The optical system 300 may include, e.g., mirrors, lenses, etc. In example embodiments, the optical system 300 may include an illumination optical system and a projection optical system.

The illumination optical system may include optical elements e.g., illumination mirrors and/or illumination lenses in order to induce the EUV light 700 generated by the light source toward the photomask M that is installed on a lower surface of the mask stage 400.

The mask stage 400 may move in a horizontal direction with the photomask M thereon. The mask stage 400 may include an electrostatic chuck for fixing the photomask M.

The photomask M may be a reflective photomask. Thus, the EUV light 700 induced to the photomask M installed at the mask stage 400 may be incident into the lower surface of the photomask M with an incident angle θ, and may be reflected to the projection optical system. The projection optical system may include optical elements, e.g., projection mirrors and/or projection lenses in order to induce the EUV light 700 reflected from the photomask M toward a wafer W mounted on the wafer stage 500.

The wafer stage 500 may move in the horizontal direction with the wafer W thereon. For example, a photoresist layer having a given thickness may be formed on the wafer W, and a focus of the EUV light 700 induced toward the wafer W mounted on the wafer stage 500 may be located within the photoresist layer.

Thus, the EUV light 700 may be illuminated on the photoresist layer on the wafer W, and the photoresist layer may be patterned based on optical pattern information of the reflective photoresist M to be transformed into a photoresist pattern. An etching object layer under the photoresist pattern may be patterned based on the photoresist pattern so that a pattern may be formed on the wafer W.

FIGS. 2 to 5 are cross-sectional views illustrating photomasks M in accordance with example embodiments.

Figure 2:
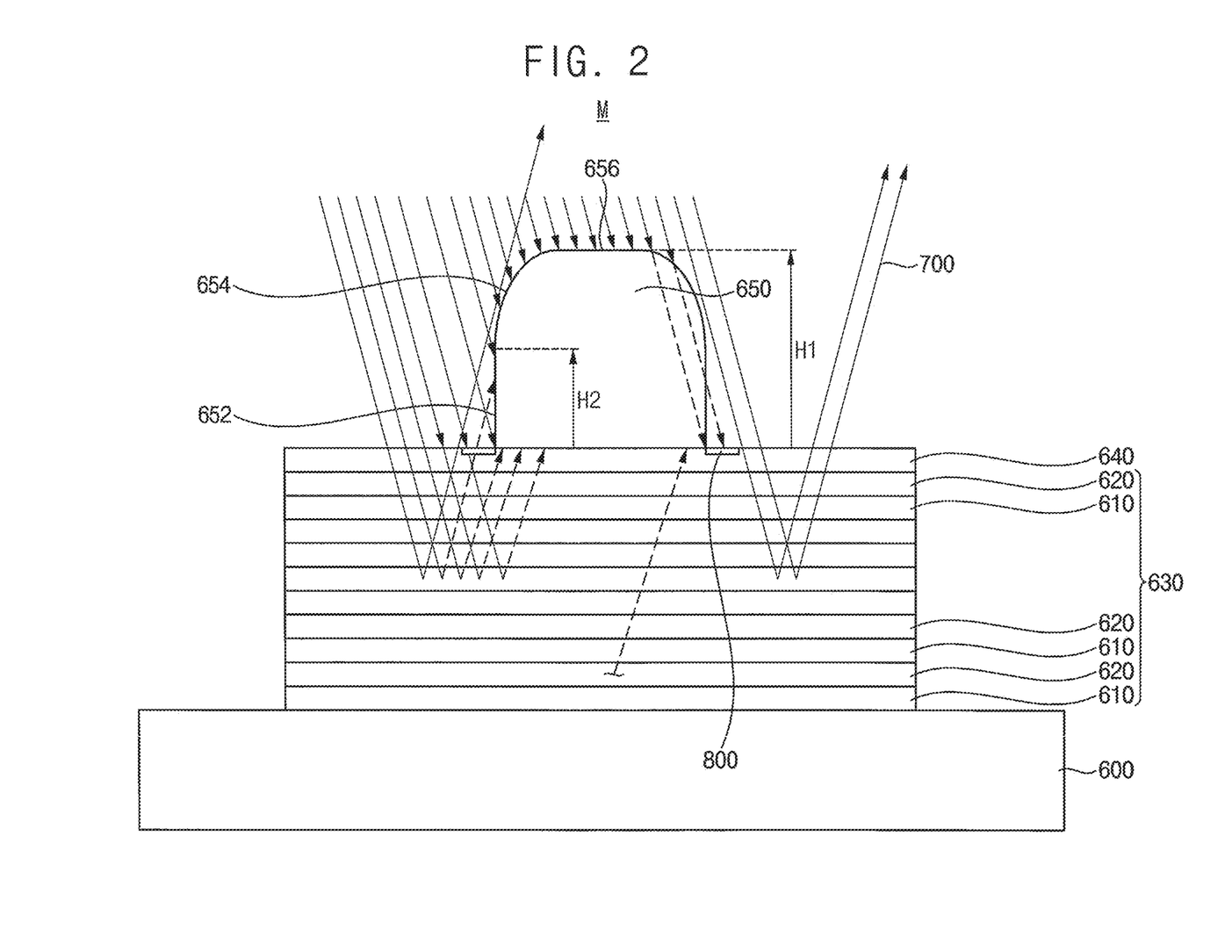
FIGS. 2 to 5 are cross-sectional views illustrating photomasks M in accordance with example embodiments.

Referring to FIG. 2, the photomask M according to example 1 may include a multi-layered structure 630, a capping layer 640 and an absorber 650 sequentially stacked on a substrate 600. Additionally, the photomask M may further include a conductive layer between the mask stage 400 and the substrate 600 and an anti-reflective layer on the absorber 650.

The substrate 600 may include a low thermal expansion material, e.g., quartz glass, silicon, silicon carbide, etc. In an example embodiment, the substrate 600 may include quartz glass doped with titanium oxide.

The multi-layered structure 630 may reflect the EUV light 700 incident onto the photomask M. The multi-layered structure 630 may include first layer 610 and a second layer 620 alternately and repeatedly stacked in a vertical direction substantially perpendicular to an upper surface of the substrate 600. In example embodiments, the first and second layers 610 and 620 may include molybdenum and silicon, respectively. Alternatively, the first and second layers 610 and 620 may include molybdenum and beryllium, respectively. The stack number or the stack order of the first and second layers might not be limited to FIG. 2.

The multi-layered structure 630 may include the first and second layers 610 and 620 having different refractive indexes and alternately stacked in the vertical direction, and may reflect the EUV light 700 incident on the multi-layered structure 630. In an example embodiment, each of the first and second layers 610 and 620 may have a thickness of about several nanometers, and the multi-layered structure 630 may have a thickness of about dozens of nanometers to about hundreds of nanometers.

The capping layer 640 may be formed on an upper surface of the multi-layered structure 630, and may protect the capping layer 640. In an example embodiment, the capping layer 640 may include ruthenium, and may have a thickness of about several nanometers.

The absorber 650 may include a material that may absorb the EUV light 700, e.g., tantalum, tantalum compound, etc. In example embodiments, the absorber 650 may include tantalum nitride or tantalum boronitride. Alternatively, the absorber 650 may include, e.g., molybdenum, palladium, zirconium, nickel silicide, titanium, titanium nitride, chrome, chrome oxide, aluminum oxide, aluminum copper alloy, etc.

In example embodiments, the absorber 650 may have a thickness of about 50 nanometers to about 70 nanometers. A plurality of absorbers 650 may be spaced apart from each other on the capping layer 640, and a pitch between the plurality of absorbers 650 may be in a range of about 30 nanometers to about 40 nanometers.

The absorber 650 may include opposite sidewalls each of which may extend in a first direction substantially parallel to the upper surface of the substrate 600 that may be spaced apart from each other in a second direction substantially parallel to the upper surface of the substrate 600 and substantially perpendicular to the first direction. In example embodiments, the absorber 650 may include first sidewalls 652 extending in the vertical direction and spaced apart from each other in the second direction, an upper surface 656 extending in a horizontal direction substantially parallel to the upper surface of the substrate 600, and a second sidewall 654 between the upper surface 656 and each of the first sidewalls 652 and connected thereto. Each of the first sidewalls 652 and the upper surface 656 may be substantially flat plane, and each of the second sidewalls 654 may be a convex curved surface having a slope with respect to the upper surface of the substrate 600 that may gradually decrease from a bottom toward a top thereof. That is, the absorber 650 may have a cross-section taken along the vertical direction that may have a shape of a rounded rectangle of which upper two corners are rounded.

The upper surface 656 of the absorber 650 may have a first height H1 in the vertical direction from an upper surface of the capping layer 640, and a top end of each of the first sidewalls 652 may have a second height H2 in the vertical direction from the upper surface of the capping layer 640. In example embodiments, the second height H2 may be about half the first height H1.

As illustrated with reference to FIG. 1, the EUV light 700 may be incident from the illumination optical system of the optical system 300 onto the photomask M with the incident angle θ, some of the EUV light 700 incident into an area where the absorber 650 is formed may be absorbed by the absorber 650, and others of the EUV light 700 incident into an area where the absorber 650 is not formed may pass through the capping layer 640 and may be reflected from an effective reflective plane of the multi-layered structure 630 to the projection optical system of the optical system 300.

The EUV light 700 may be incident onto the photomask M with an angle that might not be perpendicular but slanted with respect to the upper surface of the substrate 600 in the second direction, and thus the shadowing effect in which not only some of the EUV light 700 incident into a first area where the absorber 650 is formed but also others of the EUV light 700 incident into a second area adjacent to the first area in the second direction may be absorbed by the absorber 650 not to be reflected may occur, so that a shadow 800 may be generated.

However, in example embodiments, the absorber 650 may have the cross-section having the rounded rectangular shape in which two upper corners are rounded, and thus some of the EUV light 700 that may be absorbed by an upper portion of the absorber 650 might not be absorbed but may be reflected by the multi-layered structure 630. Accordingly, an area of the shadow 800 at an area adjacent to the absorber 650 may be reduced, and the shadowing effect, which may be one of the 3D effect of the photomask M, may be alleviated.

Figure 3:
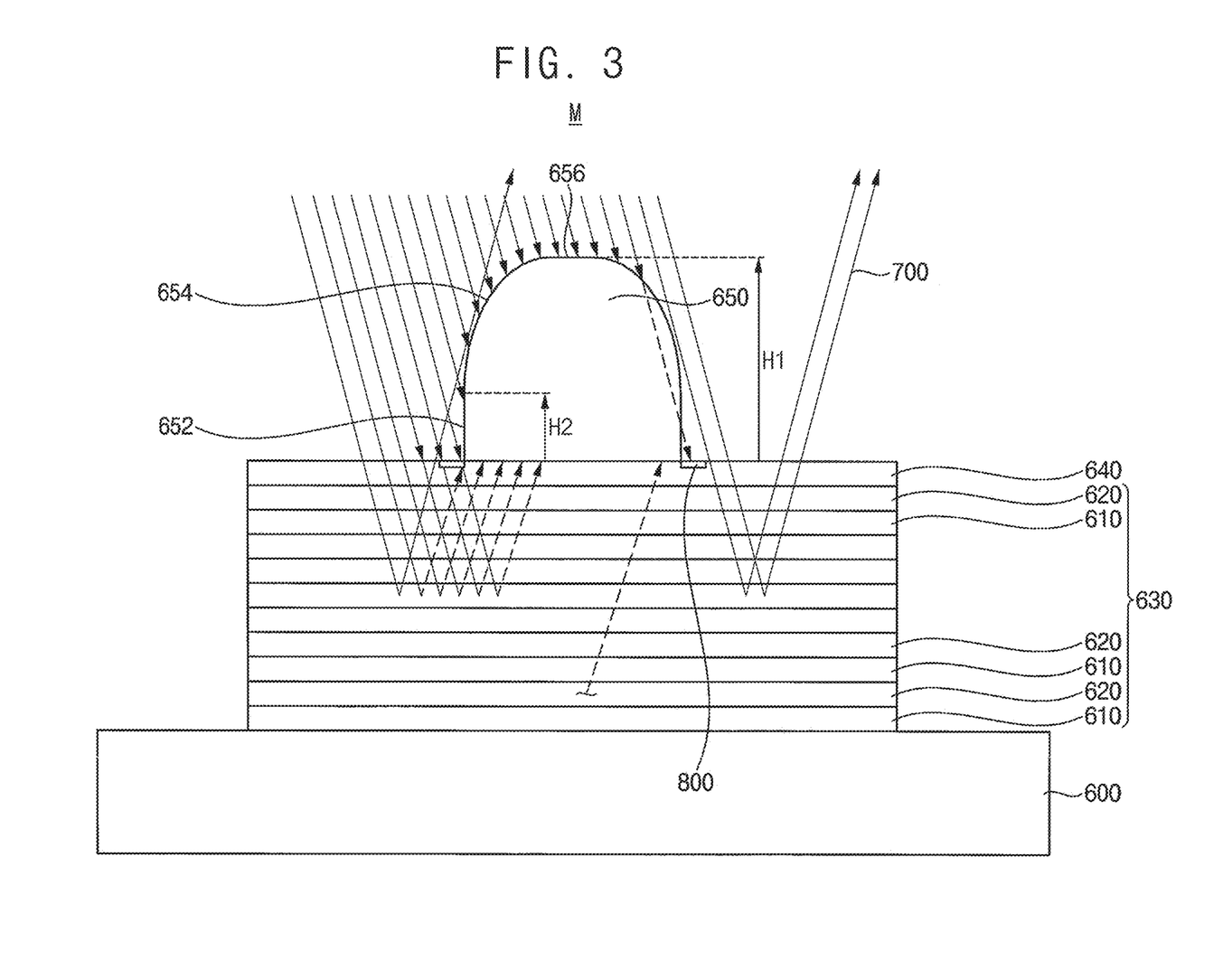

Referring to FIG. 3, in the absorber 650 included in the photomask M according to example 2, the second height H2 of the top end of each of the first sidewalls 652 in the vertical direction from the upper surface of the capping layer 640 may be about ⅓ of the first height H1.

As in the photomask M illustrated with reference to FIG. 2, the absorber 650 may have a cross-section having a rounded rectangular shape in which two upper corners are rounded, and thus some of the EUV light 700 that may be absorbed by an upper portion of the absorber 650 might not be absorbed but may be reflected by the multi-layered structure 630. Accordingly, an area of the shadow 800 at an area adjacent to the absorber 650 may be reduced, and the shadowing effect, which may be one of the 3D effect of the photomask M, may be alleviated.

Figure 4:
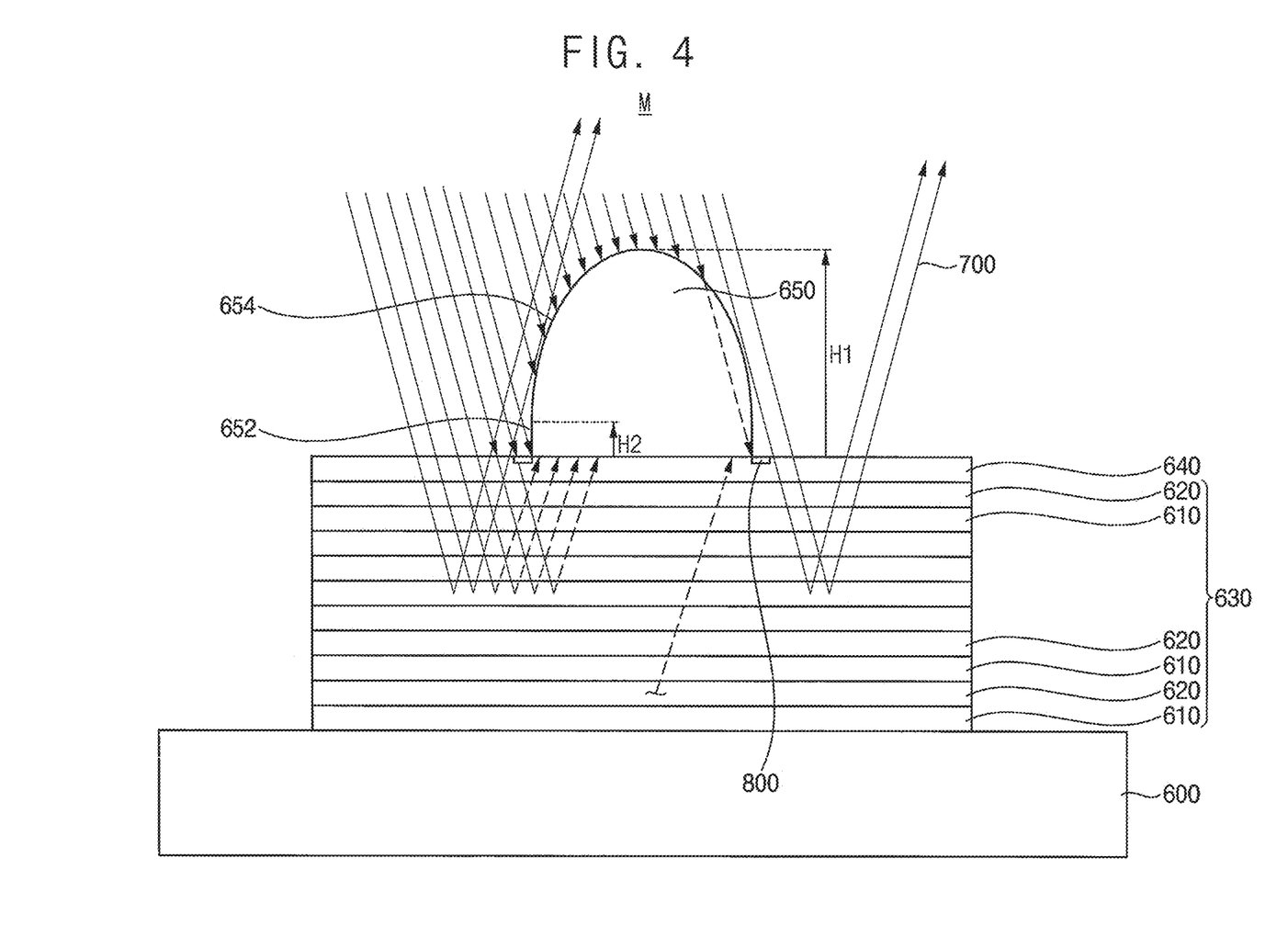

Referring to FIG. 4, in the absorber 650 included in the photomask M according to example 3, the second height H2 of the top end of each of the first sidewalls 652 in the vertical direction from the upper surface of the capping layer 640 may be about ⅙ of the first height H1, and as in the photomasks M illustrated with reference to FIGS. 2 and 3, the shadowing effect may be alleviated. According to a width in the second direction of the absorber 650, the absorber 650 may not include an upper surface, and in this case, the absorber 650 may include only the first and second sidewalls 652 and 654.

Additionally, the absorber 650 included in the photomask M may not include the first sidewalls 652, and may include only the second sidewalls 654 and the upper surface 656. That is, the absorber 650 might not include a sidewall extending in the vertical direction from a lower surface thereof and having a flat plane, but may include sidewalls that may be convex curved surface from the lower surface thereof, that is, the second sidewalls 654, and the upper surface 656. In this case, according to a width in the second direction of the absorber 650, the absorber 650 might not include the upper surface 656, and may include only the second sidewalls 654.

Figure 5:
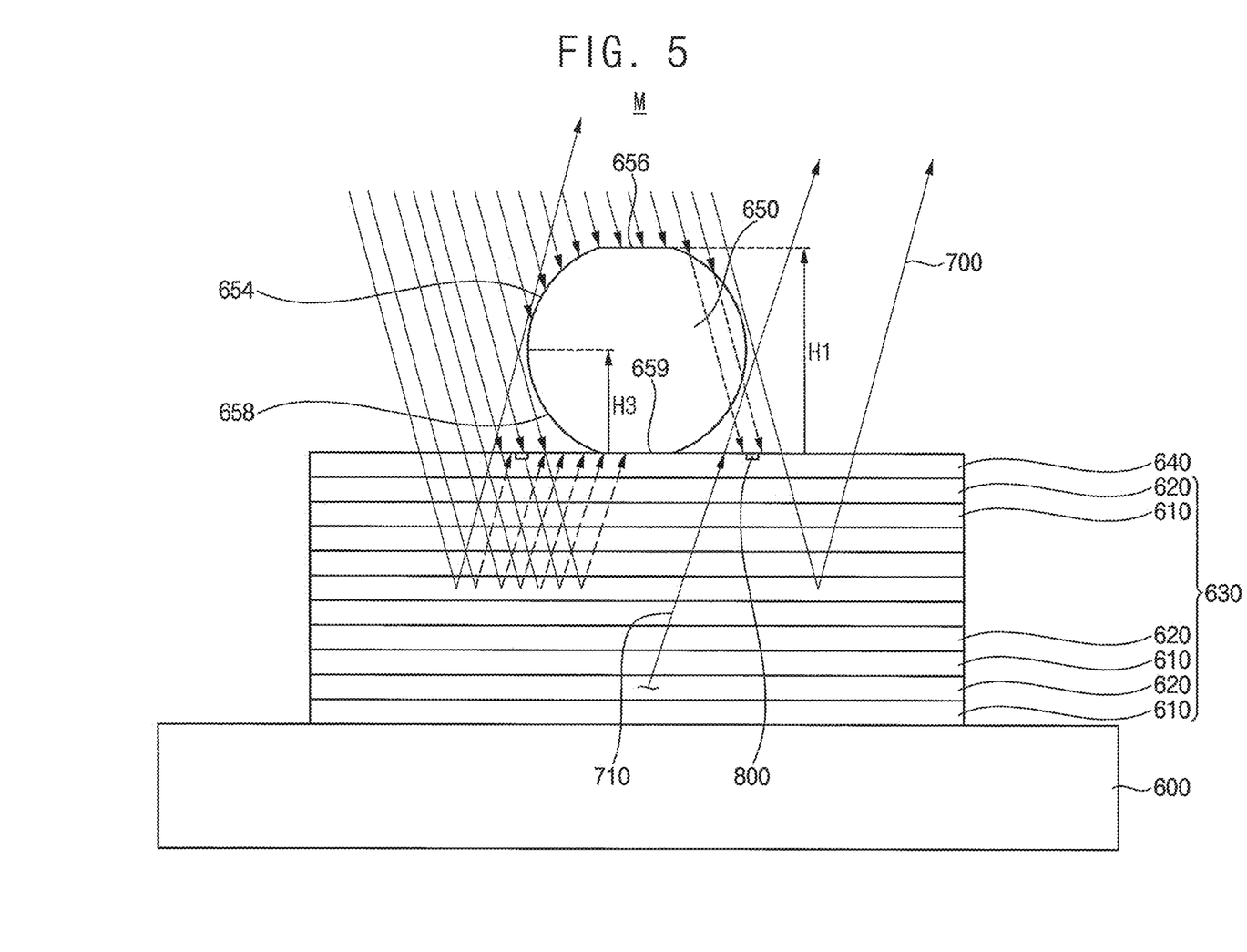

Referring to FIG. 5, the absorber 650 included in the photomask M according to example 4 may include the upper surface 656 and the second sidewalls 654, and may further include third sidewalls 658 instead of the first sidewalls 652, and a lower surface 659.

Each of the third sidewalls 658 and a corresponding one of the second sidewalls 654 may be in symmetry. That is, each of the second sidewalls 654 may be a convex curved surface having a slope with respect to the upper surface of the substrate 600 that may gradually decrease from a bottom toward a top thereof, and each of the third sidewalls 658 may be a convex curved surface having a slope with respect to the upper surface of the substrate 600 that may gradually increase from a bottom toward a top thereof. Thus, a cross-section in the vertical direction of the absorber 650 may have a shape of a circle or an ellipse except for the upper surface 656 and the lower surface 659.

The absorber 650 might not include the upper surface 656 and the lower surface 659, and in this case, the cross-section in the vertical direction of the absorber 650 may have a shape of a circle or an ellipse.

The cross-section of the absorber 650 may have the circular or elliptical shape, or a similar shape thereto, and thus some of a reflected EUV light 710 among the EUV light 700 incident into an area where the absorber 650 is not formed, which may pass through the capping layer 640 and may be reflected from the multi-layered structure 630, might not be absorbed by the absorber 650 unlike some of the reflected EUV light 710 among the EUV light 700 incident into an area where the absorber 650 having a cross-section of a rectangular shape or a rounded rectangular shape with two upper rounded corners is not formed, which may be absorbed by the absorber 650. Thus, the 3D effect may be alleviated. Likewise, an amount of the some of the reflected EUV light 710 that may be reflected from the multi-layered structure 630 not to be absorbed from the absorber 650 may be varied according to the width in the second direction of the absorber 650, the location of the effective reflective plane in the multi-layered structure 630, the magnitude of the incident angle θ, etc.

Figure 6:
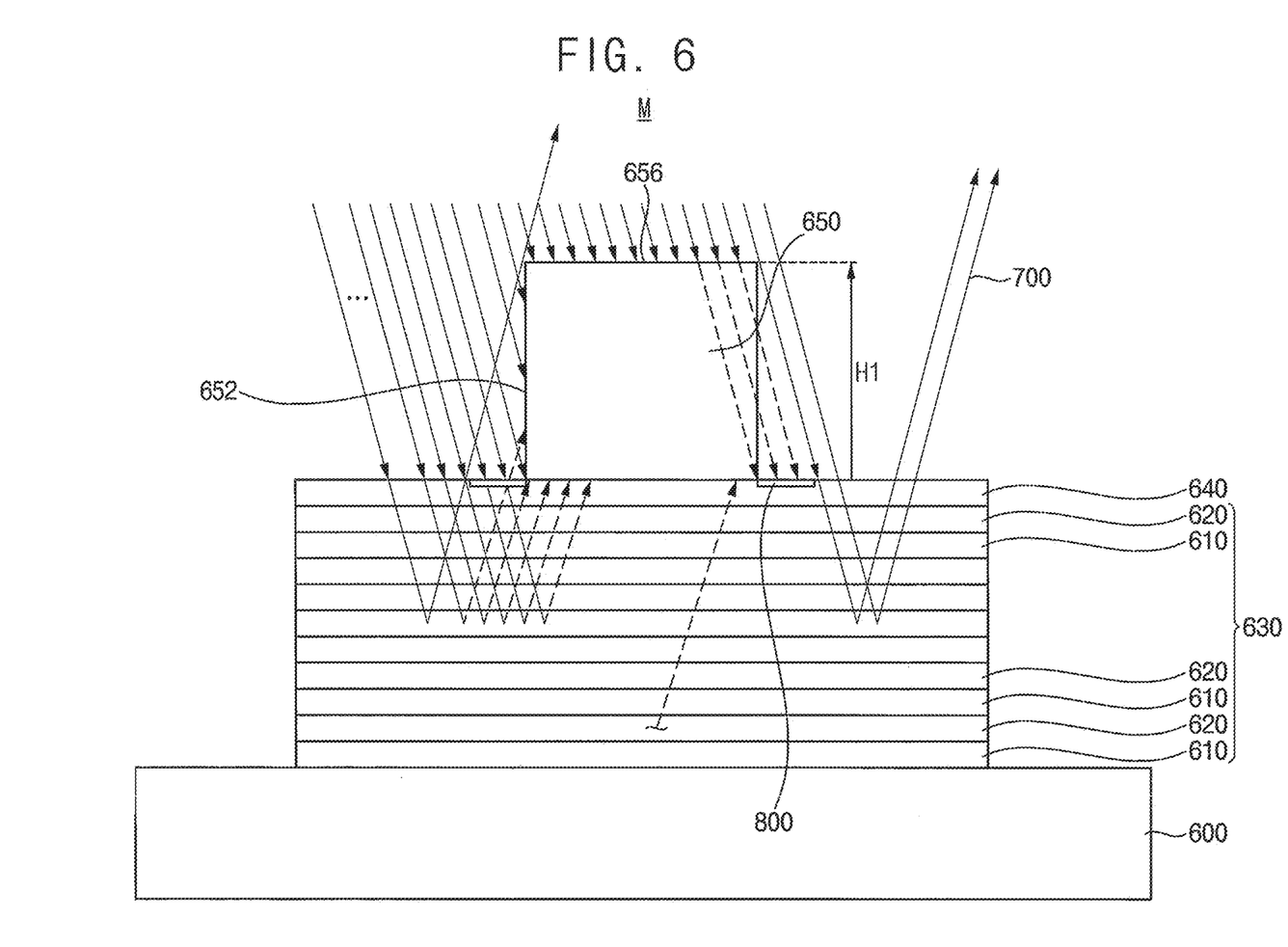
FIGS. 6 to 8 are cross-sectional views illustrating EUV photomasks M according to comparative examples.
Figure 7:
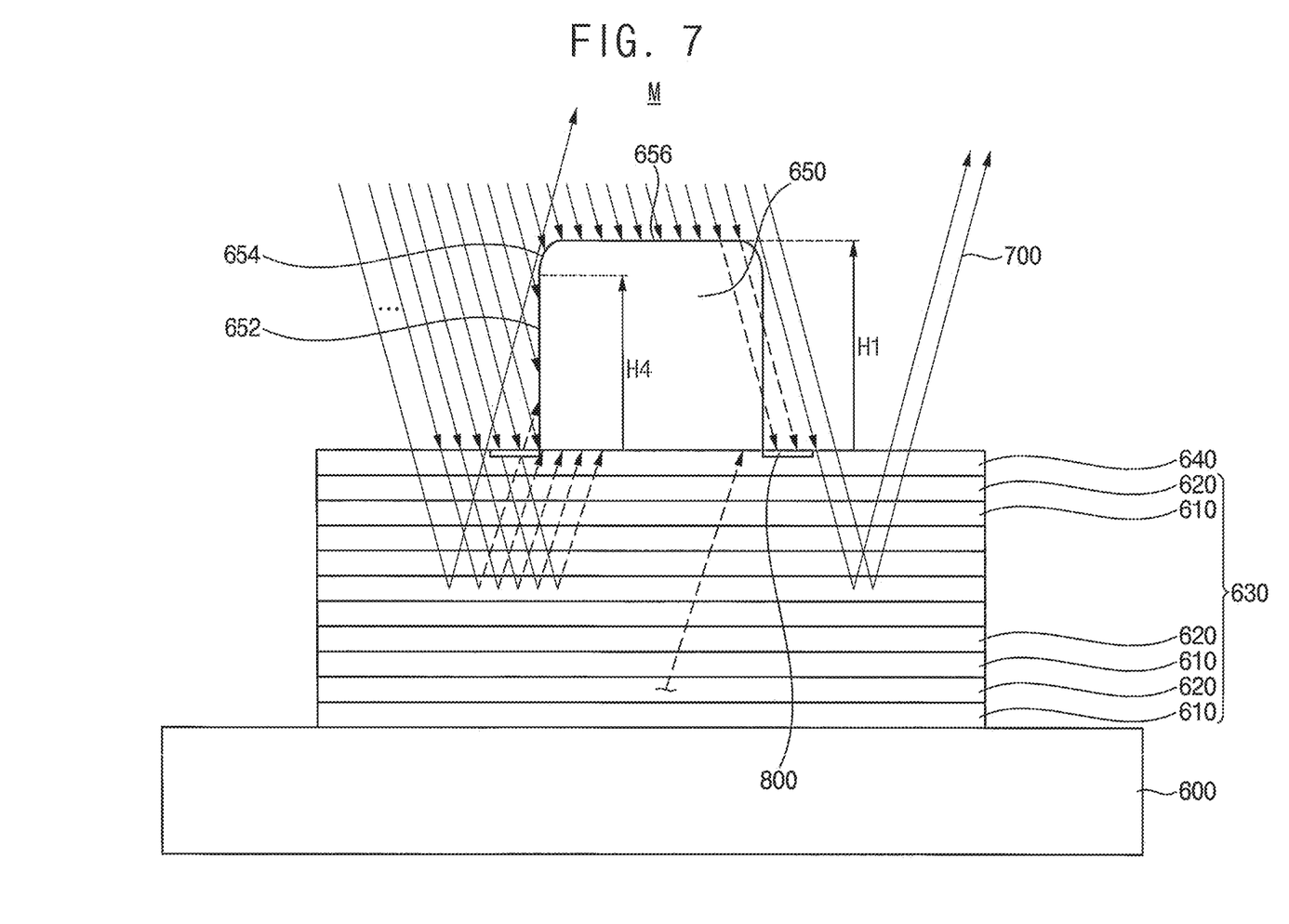
Figure 8:
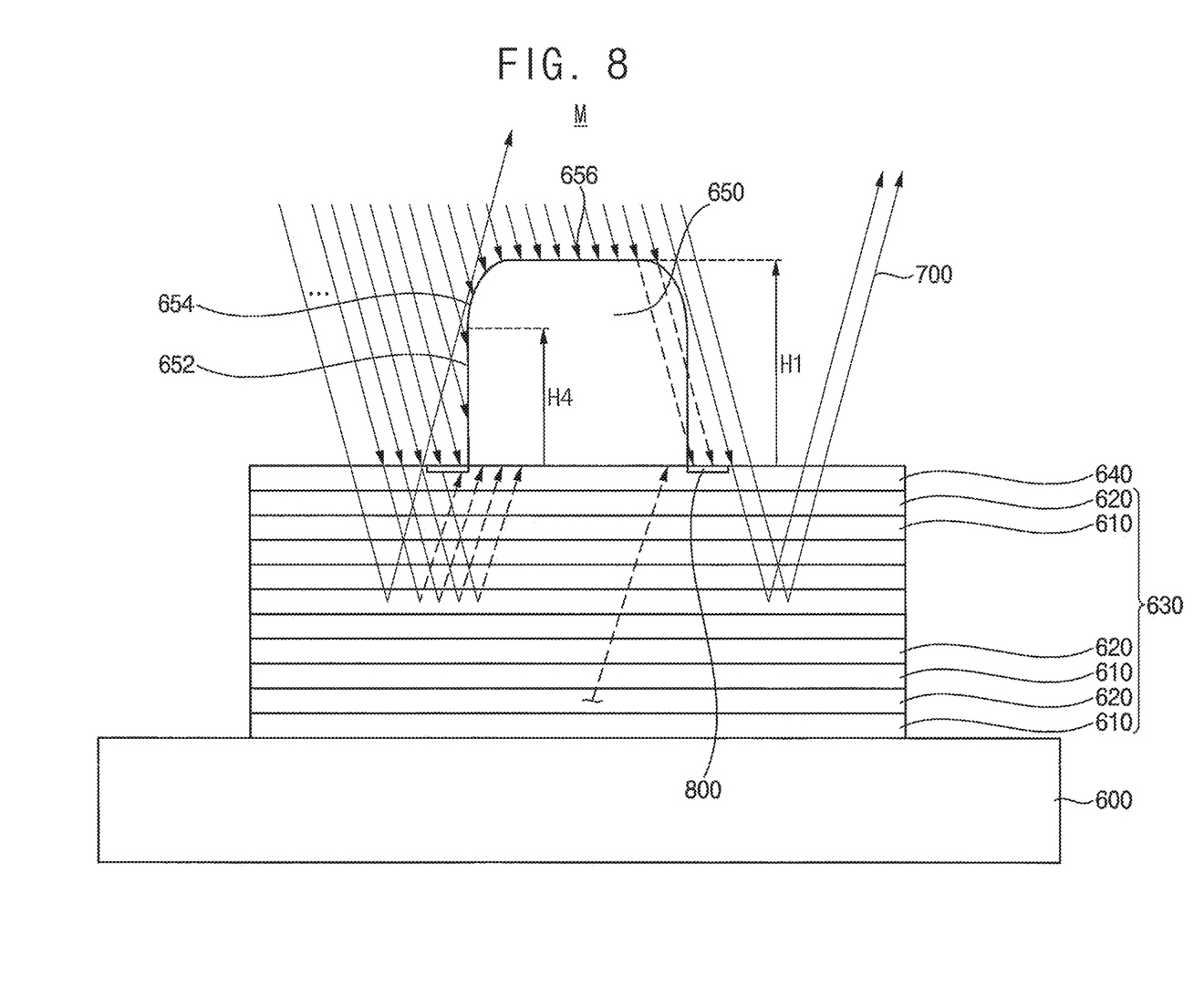

FIGS. 6 to 8 are cross-sectional views illustrating EUV photomasks M according to comparative examples.

Referring to FIG. 6, the absorber 650 included in the photomask M according to comparative example 1 may have a cross-section in the vertical direction having a shape of a rectangle.

That is, the absorber 650 may include the first sidewalls 652 having a flat plane extending in the vertical direction and the upper surface 656 having a flat plane extending in the horizontal direction, and may not include the second sidewalls 654 having a curved surface. Thus, the EUV light 700 incident onto an upper corner of the absorber 650, unlike the photomasks M illustrated with reference to FIGS. 2 to 5, may be absorbed by the absorber 650, and an area of the shadow 800 adjacent to the absorber 650 may be relatively large. Accordingly, the shadowing effect, which may be one of the photomask 3D effect, may be relatively strong.

Additionally, the EUV light 700 may be incident not in the vertical direction but in a slanted direction with respect to the upper surface of the substrate 600, and thus the EUV light 700 incident onto an upper corner of the absorber 650 may not be sufficiently absorbed, which may cause deterioration of contrast.

Referring to FIGS. 7 and 8, each of the absorbers 650 included in the photomasks M according to comparative examples 2 and 3, respectively, may include the second sidewalls 654 having a curved surface as in the absorber 650 in the photomask M according to examples.

However, a third height H3 of a top end of each of the first sidewalls 652 may be about ⅚ and ⅔, respectively, of the first height H1 of the upper surface of the absorber 650, and thus each of the second sidewalls 654 may have a relatively short length. Thus, a rounded portion in the cross-section of the absorber 650 having a shape of a rectangle may be small, so that the shadowing effect may be strong and the contrast may be deteriorated as in the photomask M according to comparative example 1.

Figure 9:
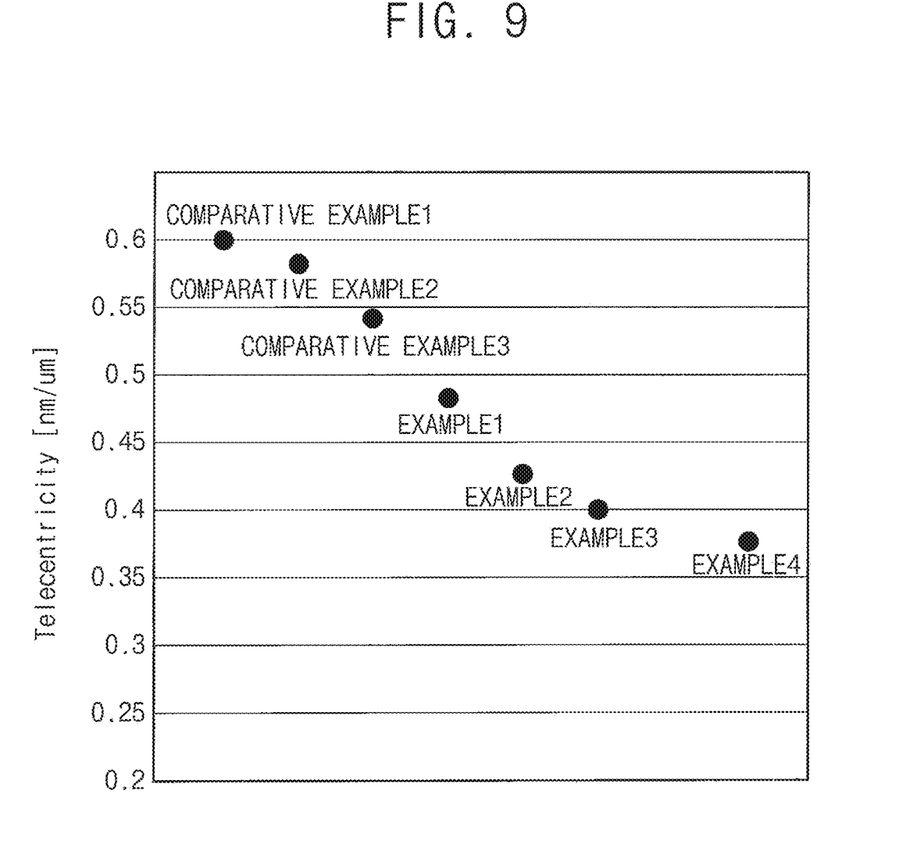
FIGS. 9 to 11 are graphs illustrating some characteristics of photomasks according to examples and comparative examples.
Figure 10:
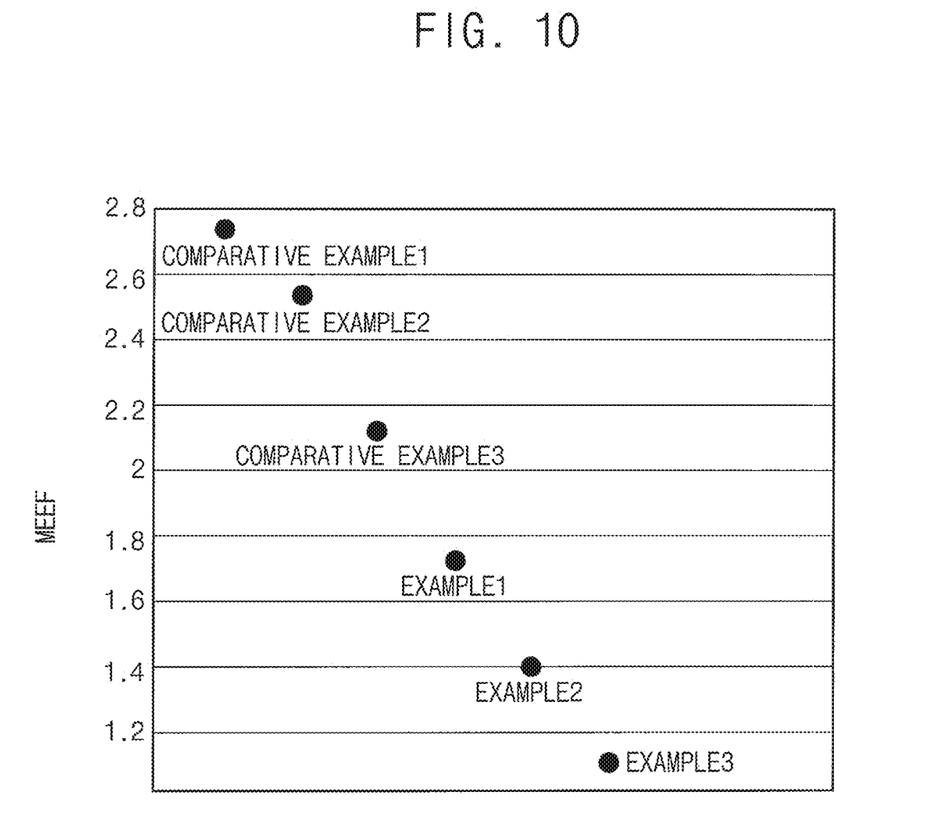
Figure 11:
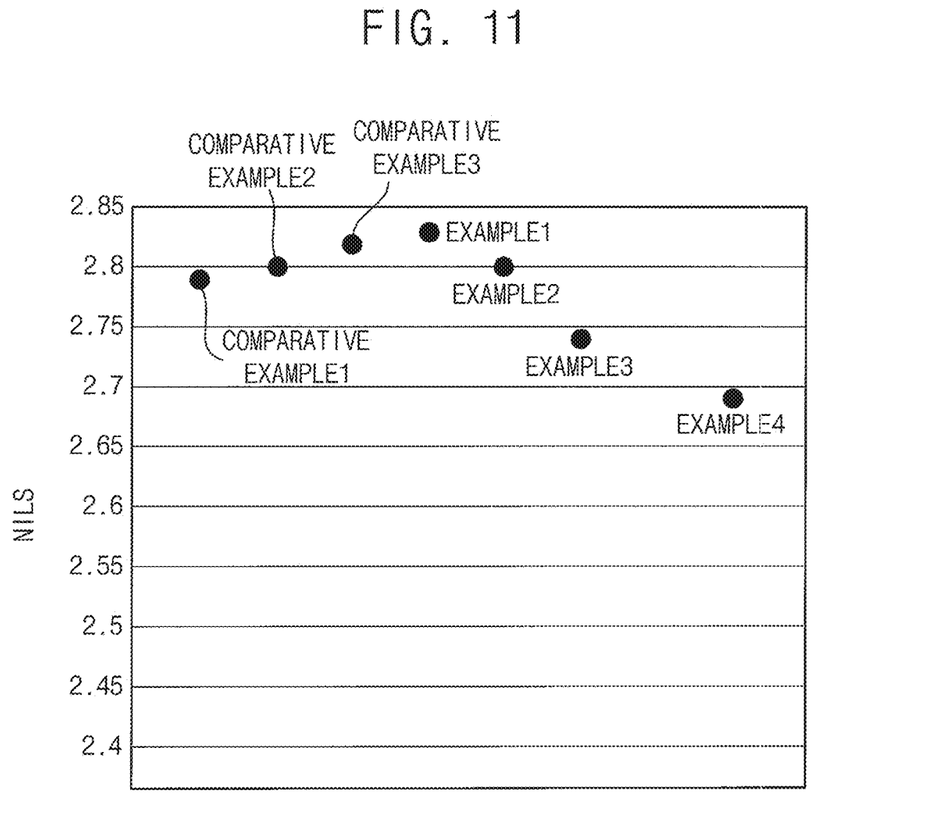

FIGS. 9 to 11 are graphs illustrating some characteristics of photomasks according to examples and comparative examples.

Particularly, FIG. 9 shows telecentricity errors of the photomasks, FIG. 10 shows mask error enhancement factor (MEEF) of the photomasks, and FIG. 11 shows normalized intensity log slope (NILS) of the photomasks. The NILS was obtained by simulation through a dipole illumination lithography method when a horizontal pattern length is about 18 nm and a pitch between the horizontal patterns is about 36 nm.

Referring to FIG. 9, the telecentricity errors of the photomasks of examples 1 to 4 are smaller than those of the photomasks of comparative examples 1 to 3. That is, the telecentricity errors of the photomasks of examples 1 to 4 have small values of less than about 0.5 nm/um (=mrad), and thus the shift phenomenon of patterns in an EUV lithography system may be reduced.

Referring to FIG. 10, the MEEFs of the photomasks of examples 1 to 4 are smaller than those of the photomasks of comparative examples 1 to 3. That is, the MEEFs of the photomasks of examples 1 to 4 have small values of less than about 1.8, and thus the amplification of the error of a pattern on a wafer due to the mask error may be reduced in an EUV lithography system.

Referring to FIG. 11, the NILS of the photomask of example 1 is greater than those of the photomasks of comparative examples 1 to 3. That is, the NILS of the photomask of example 1 has a large value of less than about 2.83, and thus the photomask may have high contrast.

As illustrated above, the photomask M according to example embodiments may have a cross-section in the vertical direction that may have a shape of a rounded rectangle, or a circle or ellipse instead of a shape of a rectangle, and thus the mask 3D effect such as the shadowing effect may be reduced. Additionally, the photomask M in some embodiments may have enhanced contrast. Furthermore, the photomasks M according to example embodiments may have reduced telecentricity errors and MEEF.

The photomasks M illustrated with reference to FIGS. 7 and 8 have been explained as comparative examples 2 and 3, however, each of the cross-sections of the absorbers 650 has the shape of a rounded rectangle, and thus, in some cases, may be included in the scope of embodiments of inventive concepts.

The foregoing is illustrative of some example embodiments and is not to be construed as limiting thereof. Although a few example embodiments have been described, those skilled in the art will readily appreciate that many modifications are possible without materially departing from the novel teachings and effects of inventive concepts. Accordingly, all such modifications are intended to be included within the scope of some example embodiments as defined in the claims.

What is claimed is:

1. An EUV photomask comprising:
a substrate;
a multi-layered structure on the substrate;
a capping layer on the multi-layered structure; and
an absorber on the capping layer,
wherein the absorber includes a first sidewall and a second sidewall,
the first sidewall extends from an upper surface of the capping layer in a vertical direction substantially perpendicular to an upper surface of the substrate,
the first sidewall is a flat plane,
the second sidewall extends from the first sidewall in the vertical direction, and
the second sidewall is a curved surface.

2. The EUV photomask as claimed in claim 1, wherein the second sidewall of the absorber is a convex curved surface having a slope with respect to the upper surface of the substrate, the slope gradually decreasing from a bottom toward a top thereof.

3. The EUV photomask as claimed in claim 1, wherein:
the absorber extends in a first direction substantially parallel to the upper surface of the substrate,
the absorber includes each of the first sidewall and the second sidewall at opposite sides of the absorber in a second direction substantially parallel to the upper surface of the substrate and substantially perpendicular to the first direction, and
top ends of the respective second sidewalls are connected with each other.

4. The EUV photomask as claimed in claim 1, wherein the absorber further includes an upper surface on the capping layer,
the upper surface extends in a horizontal direction substantially parallel to the upper surface of the substrate, and
the second sidewall of the absorber is connected to the upper surface of the absorber.

5. The EUV photomask as claimed in claim 4, wherein
the absorber extends in a first direction substantially parallel to the upper surface of the substrate, and
the absorber includes each of the first sidewall and the second sidewall at opposite sides of the absorber in a second direction substantially parallel to the upper surface of the substrate and substantially perpendicular to the first direction.

6. The EUV photomask as claimed in claim 1, wherein a height of a top end of the first sidewall of the absorber is equal to or less than about half a height of the upper surface of the absorber.

7. The EUV photomask as claimed in claim 1, wherein the absorber includes tantalum boronitride or tantalum nitride.

8. The EUV photomask as claimed in claim 6, wherein the multi-layered structure includes a plurality of first layers and a plurality of second layers alternately and repeatedly stacked in the vertical direction, and
the plurality of first layers and the plurality of second layers include different materials from each other.

9. The EUV photomask as claimed in claim 8, wherein
the plurality of first layers and the plurality of second layers include molybdenum and silicon, respectively, or
the plurality of first layers and the plurality of second layers include molybdenum and beryllium, respectively.

10. The EUV photomask as claimed in claim 1, wherein the capping layer includes ruthenium or silicon.

11. An EUV photomask comprising:
a substrate;
a multi-layered structure on the substrate;
a capping layer on the multi-layered structure; and
an absorber on the capping layer,
wherein a cross-section of the absorber in a vertical direction substantially perpendicular to an upper surface of the substrate has a shape of a rounded rectangle in which two upper corners are rounded.

12. The EUV photomask as claimed in claim 11, wherein
the absorber includes a first sidewall, an upper surface, and a second sidewall,
the first sidewall of the absorber extends from an upper surface of the capping layer in the vertical direction,
the first sidewall of the absorber is a flat plane,
the upper surface of the absorber extends on the capping layer in a horizontal direction substantially parallel to the upper surface of the substrate,
the second sidewall of the absorber is between the first sidewall of the absorber and the upper surface of the absorber and connected thereto,
the second sidewall is a convex curved surface having a slope with respect to the upper surface of the substrate that gradually decreases from a bottom toward a top thereof.

13. The EUV photomask as claimed in claim 12, wherein
the absorber extends in a first direction substantially parallel to the upper surface of the substrate, and
the absorber includes each of the first sidewall and the second sidewall at opposite sides of the absorber in a second direction substantially parallel to the upper surface of the substrate and substantially perpendicular to the first direction.

14. The EUV photomask as claimed in claim 12, wherein a top end of the first sidewall of the absorber is equal to or less than about half a height of the upper surface of the absorber.

15. The EUV photomask as claimed in claim 11, wherein the multi-layered structure includes a plurality of first layers and a plurality of second layers alternately and repeatedly stacked in the vertical direction, and
the plurality of first layers and the plurality of second layers include molybdenum and silicon, respectively, or
the plurality of first layers and the plurality of second layers include molybdenum and beryllium, respectively.

16. An EUV photomask comprising:
a substrate;
a multi-layered structure on the substrate;
a capping layer on the multi-layered structure; and
an absorber on the capping layer,
wherein a cross-section of the absorber, in a vertical direction substantially perpendicular to an upper surface of the substrate, has a shape of at least a portion of a circle or ellipse.

17. The EUV photomask as claimed in claim 16, wherein
the absorber includes a first sidewall and a second sidewall,
the first sidewall extends from an upper surface of the capping layer in the vertical direction,
the first sidewall is a convex curved surface having a slope with respect to an upper surface of the substrate that gradually increases from a bottom toward a top thereof, and
the second sidewall extends from the first sidewall in the vertical direction,
the second sidewall is a convex curved surface having a slope with respect to the upper surface of the substrate that gradually increases from a bottom toward a top thereof.

18. The EUV photomask as claimed in claim 17, wherein:
the absorber extends in a first direction substantially parallel to the upper surface of the substrate,
the absorber includes each of the first sidewall and the second sidewall at opposite sides of the absorber in a second direction substantially parallel to the upper surface of the substrate and substantially perpendicular to the first direction, and
the first sidewall and the second sidewall are connected with each other.

19. The EUV photomask as claimed in claim 17, wherein
the absorber further includes a lower surface and an upper surface,
the lower surface of the absorber contacts the upper surface of the capping layer and extending in a horizontal direction substantially parallel to the upper surface of the substrate,
the lower surface of the absorber is connected to the first sidewall of the absorber,
the lower surface of the absorber is a flat plane,
the upper surface of the absorber is connected to the second sidewall of the absorber on the capping layer, and
the upper surface of the absorber extends in the horizontal direction and is a flat plane.

20. The EUV photomask as claimed in claim 19, wherein
the absorber extends in a first direction substantially parallel to the upper surface of the substrate, and
the absorber includes each of the first sidewall and the second sidewall at opposite sides of the absorber in a second direction substantially parallel to the upper surface of the substrate and substantially perpendicular to the first direction.

* * * * *